United States Patent [19]

Lapham et al.

[11] Patent Number: 4,963,283

[45] Date of Patent: Oct. 16, 1990

[54] SOLUTIONS OF PERHALOGENATED COMPOUNDS

[75] Inventors: David J. Lapham, Derbyshire; Nicholas A. Troughton, Widnes, both of United Kingdom

[73] Assignee: Micro-Image Technology Limited, London, United Kingdom

[21] Appl. No.: 361,144

[22] Filed: Jun. 5, 1989

[30] Foreign Application Priority Data

Jun. 11, 1988 [GB] United Kingdom ............... 8813891

[51] Int. Cl.$^5$ ............................................. C23F 1/02
[52] U.S. Cl. ................................. 252/79.3; 252/79.4; 134/3; 134/38; 134/40; 134/41
[58] Field of Search ............... 252/79.3, 79.4, 100; 134/2, 3, 38, 40, 41

[56] References Cited

U.S. PATENT DOCUMENTS

| | | | |
|---|---|---|---|
| 4,080,246 | 3/1978 | Battisti et al. | 252/79.4 X |
| 4,196,060 | 4/1980 | Patrie et al. | 204/33 X |
| 4,681,657 | 7/1987 | Hwang et al. | 252/79.3 X |
| 4,781,854 | 11/1988 | Overton et al. | 252/101 X |

OTHER PUBLICATIONS

Chem. Abs., vol. 89, 1978, No. 148913, EP-A-256284, EP-A-209228.

*Primary Examiner*—David Simmons
*Assistant Examiner*—Thi Dang
*Attorney, Agent, or Firm*—Kane, Dalsimer, Sullivan, Kurucz, Levy, Eisele and Richard

[57] ABSTRACT

Perhalogenated compounds, such as perfluorinated surfactants, for inclusion in aqueous systems, are provided in a cosolvent system consisting essentially of one or more acidic phosphorous-containing compounds selected from phosphoric or phosphorous acids, water-soluble di- or polyphosphonic or phosphinic acids and water-soluble salts of any of the aforesaid, for example 1-hydroxyethylidene 1,1-diphosphonic acid, and sufficient water, if required, to form a solution. Such solutions may be included with strongly acidic and/or peroxygen compositions, for example sulphuric acid or Caro's acid and avoid the need for contamination with organic co-solvents.

12 Claims, No Drawings

SOLUTIONS OF PERHALOGENATED COMPOUNDS

BACKGROUND OF THE INVENTION

1. Field of the Invention

This invention relates to aqueous solutions of perhalogenated compounds and more especially, but not exclusively, to perfluorinated compounds.

2. Brief Description of the Prior Art

Perhalogenated, for example perfluorinated, compounds are commonly used as surfactants in aqueous systems. Such compounds are, however, often not very readily soluble in water and are often available commercially in solution in a mixture of water and a polar organic solvent for example isopropanol or methanol.

There are problems associated with the use of such solutions of perhalogenated surfactants in certain applications. Such surfactants have been included in strongly acidic solutions for example in solutions of strong mineral acids, for example to improve wetting in acid etching processes in the electronics industry or to suppress mist formation in acid electroplating baths. The term strong mineral acid is used to indicate an inorganic acid giving a pH value, in 0.1 Normal aqueous solution, of less than 1.5. Such acids include hydrochloric acid, nitric acid and sulphuric acid. It may also be desired to include perhalogenated solvents in aqueous solutions of strong organic acid, for example acetic acid or formic acid, or in aqueous solutions of peroxy compounds species such as, for example, peracetic acid, perpropionic acid, permonosulphuric acid or hydrogen peroxide Strongly acidic media tend to cause at least some decomposition of the polar organic solvent component of the solution of the perhalogenated compound leading to contamination which can be particularly deleterious in, for example, the electronics industry where the degree of precision is such that even the slightest contamination may cause the production of a faulty end-product. Peroxy compounds can also react with solvents such as the lower alcohols to cause undesired contamination of reaction media, for example photoresist stripping or semiconductor wafer cleaning solutions for use in the electronics industry.

According to the present invention an alternative solvent system is provided for perhalogenated compounds which avoids or alleviates the above disadvantages. There are also provided media including perhalogenated compounds in the said solvent system.

SUMMARY OF THE INVENTION

According to a first aspect thereof the present invention provides a solution of one or more perhalogenated compounds in one or more acidic phosphorus-containing compounds selected from phosphoric acid, phosphorous acid, or one or more water-soluble di- or polyphosphonic or di- or poly- phosphinic acids or water-soluble salts of the acidic phosphorus-containing compounds and sufficient water, if any, required to form the solution

DETAILED DESCRIPTION OF THE PREFERRED EMBODIMENTS OF THE INVENTION

In the solutions provided by the present invention the presence of a small quantity of organic solvent is not excluded although it is preferred that no organic solvent be present, i.e. that the co-solvent be totally aqueous and that save for the perhalogenated compound or the phosphonic or phosphinic acid or salt, no carbon-containing compound be present.

The present invention is particularly applicable to the perfluorinated surfactants. Suitable perfluorinated surfactants are the perfluorinated sulphonic acids having the general formula $$C_nF_{2n+1}SO_3H$$

where $C_n$ denotes a chain, straight or branched containing from 5 to 20 carbon atoms. The acids are toxic and because of this suitable salts such as the alkali metal salts, for example the sodium or potassium salts are preferably used. For some uses, notably for use in the electronics industry, metals are preferably not present, and an ammonium salt is preferred. An example of a particularly suitable perfluorinated surfactant is that having the formula $C_8F_{17}SO_3NH_4$. Perfluorinated surfactants are available from the 3M Company.

The perhalogenated surfactant as usually available in commerce in a mixed aqueous/organic solvent system may be utilized in the practice of this invention by evaporating the entire solvent system, preferably at ambient or only slightly elevated temperature, for example at a temperature of not more than 50° C. for the required period, which may be several days, to achieve substantially complete removal of the organic solvent. The resulting solid may be broken up into a powder. Alternatively the surfactant may be synthesized by known means to give a solid product.

The acidic phosphorus-containing compounds for example the water-soluble di- or polyphosphonic or di- or polyphosphinic acids or water-soluble salts thereof are utilised in the present invention in the unique role of a co-solvent and not, primarily, for their known sequestrant properties.

Preferably the phosphonic or phosphinic acids or salts are according to one of the general formulae (i) to (v) as follows:

(i) $P_2-(X)_n$
(ii) $[P(X)_n]_3N$
(iii) $[[P(X)_n]_2N]_2(X)_n$
(iv) $[[P(X)_n]_2N(X)_n]_2N(X)_nP$
(v) $[[P(X)_n]_2N(X)_n]_3N$ where P represents a phosphonic or phosphinic acid radical or water-soluble salt (preferably ammonium) of such a radical, N represents a nitrogen atom, X represents the methylene or substituted methylene radical $-CR_2$ or, where $X_n$ is directly bonded to 2 nitrogen atoms and n is greater than 1, two adjacent X groups may represent a part of a cycloalkyl, preferably a cyclohexyl, group, n represents a whole number from 1 to 5, R represents $-H$, $-OH$ or $-(CH_2)_zH$ or part of a shared cycloalkyl group, z is a whole number from 1 to 5, Preferably P represents a phosphonic acid or a partial ammonium salt thereof and X represents $-CH_2-$ or $-CH.OH-$ or, where n=2, $-CH_2-CH.OH-$ or $-CH_2CH_2-$ Particularly preferably, where $P(X)_n$ is linked directly to a N atom, X represents $-CH_2-$.

Compounds according to the above general formulae are widely available commercially usually as solutions, e.g. of 50% to 75% by weight, in water, for example from the Monsanto company under the Trade Name "Dequest".

Specific available compounds are:
Formula (i)
1-hydroxyethylidene 1,1-diphosphonic acid (Dequest 2010)
Formula (ii)
aminotrimethylene phosphonic acid (Dequest 2000)
Formula (iii)
ethylene diamine tetra (methylene phosphonic acid) ammonium salt (Dequest 2042) and the hexamethylene diamine variant of the last compound (Dequest2052)
Formula (iv)
diethylenetriaminepenta (methylene phosphonic acid) (Dequest 2060)

The product "Dequest" 2010, containing 40% water, is particularly suitable where the aqueous solution of the strong mineral acid is to be used for the treatment of semiconductor wafers in the electronics industry or in the manufacture of integrated electrical circuits. Similar products are also available under the Trade Names "Mykon" P060 and "Briquest" APPA 60A.

In preparing the solutions according to the invention it will not usually be necessary to achieve a very high concentration of the surfactant since the latter will be required in use only in part per million quantities, for example from 20 parts to 250 parts or even to 500 parts per million by weight. A suitable priming solution of the surfactant containing from 0.5% or 1% to about 15% thereof may readily be produced although priming solutions containing from 2% to 10% by weight of surfactant may be preferred for general use. The quantity of the acidic phosphorus-containing compound is preferably at least 15% by weight for example, very suitably, at least 20% by weight of the priming solution and up to 85% by weight or more.

A quantity of water is present in the solutions according to this invention. The minimum quantity of water varies according to the particular acidic phosphorus-containing compound used. When 85% by weight phosphoric acid is used, for example, the quantity of water already present in the acid is sufficient and the perhalogenated compound may be directly dissolved. However when the phosphonic or phosphinic acids or salts are used a greater total quantity of water, preferably at least 40% by weight and particularly preferably at least 50% for example, very suitably, at least 60% and even up to 80% by weight or more of the priming solution is used and the upper limit for the quantity of the phosphonic or phosphinic acid or salt will be limited accordingly. The quantity of water used therefore, is a quantity which is effective to achieve dissolution of the perhalogenated compound. Dissolution is preferably assisted by the use of above ambient temperature, for example up to 100° C. and by agitation, for example by ultrasonic means e.g. by the application of pulses of waves having a frequency above 10 KHz.

According to a further aspect thereof and with reference to the preceding description the present invention also provides an aqueous acidic or peroxygen-containing solution containing one or more perhalogenated compounds, one or more water-soluble acidic phosphorus-containing compounds selected from phosphoric acid, phosphorous acid, di- or polyphosphonic acids, di- or polyphosphinic acids or water-soluble salts of any of the aforesaid and an effective quantity of water for the dissolution of the perhalogenated compound. It is envisaged that these solutions be prepared by the inclusion in the aqueous acidic or peroxygen-containing compound a solution of the perhalogenated compound as first above provided by the invention.

The invention particularly provides such solutions in which the solution of the perhalogenated compound, is included in concentrated sulphuric acid, for example having an initial concentration of acid of at least 80% and being present in a quantity to give, for example, from 10 to 250 parts per million by weight in the solution of the perfluorinated compound.

Particularly useful solutions according to this further aspect of the invention are Caro's acid solutions which may advantageously be used as photoresist stripping or cleaning solutions in the electronics industry. Such solutions may be prepared by adding aqueous hydrogen peroxide at for example 60% by weight to 86% by weight concentration slowly, and with temperature control at below 20° C. preferably at from 5° C. to 15° C., to concentrated sulphuric acid preferably having a concentration of from 50% by weight to 99% by weight. For use as a photoresist stripping solution the quantity of water present is preferably less than 10% by weight and the quantity of hydrogen peroxide is preferably sufficient to allow the formation of at least 4% by weight of permonosulphuric acid in the solution.

The solution of a perfluorinated surfactant according to this invention may be included in the sulphuric or Caro's acid solutions as above described, preferably in a quantity which provides from 10 to 500 parts particularly preferably from 20 to 250 parts per million by weight of the perfluorinated compound and from 0.05% to 1% by weight, particularly preferably from 0.1% to 0.4% by weight, of the total solution of the water-soluble acidic phosphorus-containing compound. Preferably the solution of the perfluorinated surfactant is included in the acid before the addition of the hydrogen peroxide to form Caro's acid. Preferably the phosphorus-containing compound used is 1-hydroxyethylidene 1,1-diphosphonic acid (for example the product known by the Trade Name Dequest 2010). Preferably such Caro's acid solutions also contain one or more metal oxides or hydrous oxides as stabilisers as taught in our copending patent application U.S. Ser. No. 361,143. filed June 5, 1989 entitled "Solutions of permonosulphuric acid". Such oxides or hydrous oxides may be of one or more of gallium, germanium, indium, tin, antimony, thallium, bismuth and lead in a total quantity of from about 400 to about 1000 picomoles per kg of solution.

To achieve a maximum storage life and/or when the solutions are intended for use in the electronics industry, the solutions are preferably made up using pure ingredients, particularly acid, hydrogen peroxide and water having a low content of metallic impurities and of particles. Particularly preferably these materials are of electronic grade specification which fulfill the preferred, particularly preferred or optimal characteristics as to content of metallic impurities, calculated as the metal, and of particles set out in Tables 1 and 2 below.

TABLE 1

| Metal | Maximum concentration - µg/Kg | | |
|---|---|---|---|
| | Preferred | Particularly preferred | Optimal |
| Cobalt | 100 | 50 | 10 |
| Chromium | 100 | 50 | 10 |
| Copper | 100 | 50 | 10 |
| Iron | 1000 | 500 | 100 |
| Manganese | 100 | 50 | 10 |

TABLE 1-continued

| | Maximum concentration - μg/Kg | | |
|---|---|---|---|
| Metal | Preferred | Particularly preferred | Optimal |
| Nickel | 100 | 50 | 10 |
| Zinc | 500 | 250 | 50 |

TABLE 2

| Particle concentration maxima (number ≧ given size in 10 ml) | | |
|---|---|---|
| Particle size Microns | Preferred | Particularly preferred |
| 0.5 | 2000 | 1500 |
| 1.0 | 500 | 300 |
| 2.0 | 120 | 70 |
| 5.0 | 16 | 10 |
| 10.0 | 4 | 2.5 |
| 15.0 | 1.7 | 1 |

The invention will now be more particularly described by reference to the following Examples of which Examples 4, 6, 7, 9, 10 and 12 are present for comparative purposes.

In the Examples a perfluorinated surfactant having the formula $C_8F_{17}SO_3NH_4$ was utilised. This material is available from the 3M Company in a 73/27 volume water/isopropanol solution under the Trade Name "FC93". This material was allowed to dry out in a vented cupboard over a period of 1 week at ambient interior temperature (20° C.). At the end of that period isopropanol could not be detected in the vented gases. The residual powdery material was used in the following experiments in which it is referred to as "surfactant".

As co-solvent, with water, according to the invention there was used the product Dequest 2010 identified above. This is a 60% by weight active content solution in water of the relevant phosphonic acid salt. This product is referred to hereafter as "phosphonate".

Solutions of strong mineral acid containing one or both of the above additives were subjected to tests to determine whether their surface tension had decreased and to determine in some instances, whether the presence of the additives had any adverse effect on the stability, under accelerated test conditions, of hydrogen peroxide, containing 4 parts per million of Sn introduced as sodium stannate also included therewith. The purpose of the hydrogen peroxide stability test was to establish the suitability of the products of the invention for use in sulphuric acid/hydrogen peroxide photoresist stripping solutions (>90% acid) or semiconductor cleaning solutions (60%–80% acid) in the electronics industry.

The surface tension test referred to above comprised the measurement of the flow rate of the sulphuric acid through a burrette with a constant orifice, the faster the flow rate the lower the surface tension. The hydrogen peroxide stability test comprised the determination of the % reduction in the available oxygen content of the acid solution, after 5 hours heating at 70° C. Such an accelerated test has been found to give a good indication of room temperature storage performance an accelerated decomposition of not more than about 10% indicating a shelf storage life at or below 20° C. of at least 3 months and usually at least 9 months.

EXAMPLES 1–4

0.07 g of the surfactant powder was added to 200 ml of 98% by weight sulphuric acid (Example 1) and of 77% by weight sulphuric acid (Example 2). The samples were subjected to ultrasonic agitation for 2 minutes at 70° C. and were left to stand overnight. In neither case had the surfactant powder fully dissolved. A slight reduction in surface tension was detected in Example 2 but none in Example 1.1

4g of the surfactant powder was added to 35g of the phosphonate aqueous solution (Example 3). After similar ultrasonic agitation at 70° C. the surfactant had not dissolved completely and after overnight storage the solution had gelled. When an additional 35 g of demineralised water was added to the solution (Example 4) the surfactant powder dissolved readily under ultrasound and after overnight storage was found to be a clear yellowish liquid with a foaming head. This solution was used in the following Examples and any reference to the inclusion of "surfactant solution" in acid implies the accompanying inclusion of phosphonate unless otherwise stated. In one example (Example 11), in contrast, the commercial water/isopropanol solution of surfactant was used.

EXAMPLES 5–7

Surfactant solution was added to 95% sulphuric acid to give solutions containing 50 parts per million and 200 parts per million by weight (ppm) of the surfactant. The flow rates of the resulting solutions through a burrette in comparison with the sulphuric acid without such additions were estimated by a visual count of drops of solution per minute:

| Ex 5 | 95% wt sulphuric acid | 8 drops/minute |
|---|---|---|
| Ex 6 | Acid + 50 ppm surfactant | 24 drops/minute |
| Ex 7 | Acid + 200 ppm surfactant | 24 drops/minute |

While the change in number of drops per minute cannot be taken to indicate an equivalent change in surface tension some substantial change has evidently been achieved.

EXAMPLES 8–11

The following solutions were prepared and stirred to redissolve a slight initial precipitate

| Ex 8 | 200 ml 95% wt $H_2SO_4$ |
|---|---|
| | 5 ml 86% wt $H_2O_2$ |
| | 0.7 g phosphonate |
| Ex 9 | 200 ml 95% wt $H_2SO_4$ |
| | 5 ml 86% wt $H_2O_2$ |
| | 0.35 g phosphonate |
| | 0.74 g surfactant solution |
| | (equivalent to 50 ppm of surfactant and 0.2% wt of phosphonate) |
| Ex 10 | 200 ml 95% wt $H_2SO_4$ |
| | 5 ml 86% wt $H_2O_2$ |
| | 1.56 g surfactant solution |
| | (equivalent to 100 ppm of surfactant) |

Available oxygen decomposition tests gave the following results
Ex 7: 7% decomposition
Ex 8: 9% decomposition
Ex 9: 7% decomposition
The surface tension tests gave the following results Ex 7: 132 seconds/ml
Ex 8: 112 seconds/ml
Ex 9: 88 seconds/ml When 0.28 g of liquid surfactant (i.e. the commercial water/isopropanol solution available as "FC93") was introduced into a formulation identical to that of Ex 1 the available oxygen decomposition was found to have increased to 14.3% (Ex 11).

When Example 8 was modified by replacing the phosphonate by (a) phosphoric acid and (b) phosphorous acid the decomposition was respectively (a) 18% and (b) 14%. While these results show a disimprovement the compositions are nevertheless commercially usable.

EXAMPLES 12-13

The following solutions were prepared.

| Ex 12 | 200 ml 77% wt sulphuric acid |
| | 6.5 ml 86% wt hydrogen peroxide |
| | 0.66 g phosphonate |
| Ex 13 | 200 ml 77% wt sulphuric acid |
| | 6.5 ml 86% wt hydrogen peroxide |
| | 0.98 g surfactant solution |
| | (equivalent to 50 ppm surfactant) |

The times taken for these solutions to run through a standard burette were:
Ex 11: 162 seconds
Ex 12: 80 seconds

We claim:

1. A solution of a perfluorinated sulphonic acid surfactant in a solvent system, said solution being miscible with strong mineral or organic acid to reduce the surface tension thereof, in which solution the solvent system consists essentially of one or more acidic phosphorous containing compounds selected from water soluble di- or poly-phosphonic acids, water soluble di- or poly-phosphinic acids and water soluble salts of any of the aforesaid acids together with the sufficient water to form the solution.

2. A solution comprising a mixture of a solution as claimed in claim 1 with one or more strong mineral or organic acids.

3. A solution as claimed in claim 2 wherein said one or more strong mineral or organic acids is concentrated sulphuric acid.

4. A solution as claimed in claim 3 wherein the perfluorinated sulphonic acid surfactant is present in from 10 parts to 500 parts per million by weight of the total solution.

5. A solution as claimed in claim 3, wherein the one or more acidic phosphorous-containing compounds is present in from 0.05% to 1% by weight of the total solution.

6. A solution as claimed in claim 2 wherein said one or more strong mineral or organic acids is Caro's acid.

7. A solution as claimed in claim 2 additionally containing one or more peroxygen compounds.

8. A solution as claimed in claim 1 wherein the acidic phosphorus-containing compound or compounds is or are selected from compounds having the general formulae:

(i) $P_2-(X)_n$
(ii) $[P(X)_n]_3N$
(iii) $[P(X)_n]_2N_2(X)_n$
(iv) $[P(X)_n]_2N(X)_{n2}N(X)_nP$
(v) $[P(X)_n]_2N(X)_{n3}N$ where P represents a phosphonic or phosphinic acid radical or water-soluble salt of such a radical, N represents a nitrogen atom, X represents the methylene or substituted methylene radical —CR, or where $X_n$ is directly bonded to 2 nitrogen atoms and n is greater than 1, two adjacent X groups may represent a part of a cycloalkyl group n represents a whole number from 1 to 5, R represents —H, —OH or —$(CH_2)_zH$ or part of a shared cycloalkyl group, z is a whole number from 1 to 5.

9. A solution as claimed in claim 4 wherein the one or more acidic phosphorus-containing compounds is selected from 1-hydroxyethylidene 1,1-diphosphonic acid, aminotrimethylene phosphonic acid, ethylene diamine tetra (methylene phosphonic acid) ammonium salt and the hexamethylene diamine variant thereof and diethylenetriaminepenta (methylene phosphonic acid).

10. A solution as claimed in claim 1 containing from 0.5% to 15% by weight of the perfluorinated sulphonic acid surfactant.

11. A solution as claimed in claim 1 containing from 15% to 85% by weight of the one or more acidic phosphorous-containing compounds.

12. A solution as claimed in claim 1 containing from 14% to 80% by weight of water.

* * * * *